(12) United States Patent
Debray et al.

(10) Patent No.: US 7,261,837 B2
(45) Date of Patent: *Aug. 28, 2007

(54) ARRANGEMENT OF LUMINESCENT MATERIALS, WAVELENGTH-CONVERTING CASTING COMPOUND AND LIGHT SOURCE

(75) Inventors: Alexandra Debray, Nürnberg (DE); Günter Waitl, Regensburg (DE); Franz Kummer, München (DE); Franz Zwaschka, Ismaning (DE); Andries Ellens, München (DE)

(73) Assignee: Osram Opto Semiconductors GmbH & Co. OHG (DE)

( * ) Notice: Subject to any disclaimer, the term of this patent is extended or adjusted under 35 U.S.C. 154(b) by 0 days.

This patent is subject to a terminal disclaimer.

(21) Appl. No.: 11/296,673

(22) Filed: Dec. 7, 2005

(65) Prior Publication Data

US 2006/0133063 A1    Jun. 22, 2006

Related U.S. Application Data

(60) Continuation of application No. 10/840,575, filed on Sep. 24, 2004, now Pat. No. 6,998,771, which is a division of application No. 09/786,086, filed as application No. PCT/DE00/02405 on Jul. 24, 2000.

(30) Foreign Application Priority Data

Jul. 23, 1999 (DE) .............................. 199 34 126
Dec. 30, 1999 (DE) .............................. 199 63 791

(51) Int. Cl.
*H05B 33/00* (2006.01)
*C09K 11/80* (2006.01)

(52) U.S. Cl. .................. 252/301.36; 252/301.4 R; 252/301.4 F; 313/503; 257/98

(58) Field of Classification Search ............... None
See application file for complete search history.

(56) References Cited

U.S. PATENT DOCUMENTS

| | | | |
|---|---|---|---|
| 4,550,256 A | 10/1985 | Berkstresser et al. | |
| 4,801,398 A | 1/1989 | Ohno et al. | |
| 5,701,054 A | 12/1997 | Park et al. | |
| 5,847,507 A | 12/1998 | Butterworth et al. | |

(Continued)

FOREIGN PATENT DOCUMENTS

EP    0124175    11/1984

(Continued)

OTHER PUBLICATIONS

CN1254747, Abstract.

(Continued)

*Primary Examiner*—C. Melissa Koslow
(74) *Attorney, Agent, or Firm*—Fish & Richardson P.C.

(57) ABSTRACT

The invention proposes an arrangement of luminescent materials for excitation by means of a radiation source and involving the use of a luminescent material having a Ce-activated garnet structure $A_3B_5O_{12}$, in which the first component A contains at least one element from the group consisting of Y, Lu, Sc, La, Gd, Sm and Tb and the second component B represents at least one of the elements Al, Ga and In, and a plurality of the luminescent materials are mixed together.

34 Claims, 2 Drawing Sheets

U.S. PATENT DOCUMENTS

| | | | |
|---|---|---|---|
| 5,998,925 A * | 12/1999 | Shimizu et al. | 313/503 |
| 6,245,259 B1 | 6/2001 | Hohn et al. | |
| 6,294,800 B1 | 9/2001 | Duggal et al. | |
| 6,504,179 B1 * | 1/2003 | Ellens et al. | 257/88 |
| 6,552,487 B1 * | 4/2003 | Ellens et al. | 313/503 |
| 6,669,866 B1 * | 12/2003 | Kummer et al. | 252/301.4 R |
| 6,734,465 B1 * | 5/2004 | Taskar et al. | 257/80 |
| 6,765,237 B1 * | 7/2004 | Doxsee et al. | 257/98 |
| 6,897,490 B2 * | 5/2005 | Brunner et al. | 257/98 |
| 6,998,771 B2 * | 2/2006 | Debray et al. | 313/503 |
| 2002/0195587 A1 | 12/2002 | Srivastava et al. | |

FOREIGN PATENT DOCUMENTS

| | | |
|---|---|---|
| EP | 0142931 | 5/1985 |
| GB | 2000173 | 1/1979 |
| GB | 1 600 492 | 10/1981 |
| JP | 49-003629 | 1/1974 |
| JP | 49-003631 | 1/1974 |
| JP | 60-144381 | 7/1985 |
| JP | 10-247750 | 9/1998 |
| WO | WO97/05078 | 2/1997 |
| WO | WO98/05078 | 2/1997 |
| WO | WO97/50132 | 12/1997 |
| WO | WO98/12757 | 3/1998 |
| WO | WO 0182385 | 11/2000 |

OTHER PUBLICATIONS

G.W. Berkstresser et al., "Growth Parameter Optimization and $Tb^{3+}$ Sensitization of $Ce^{3+}$ Activated $Y_3Al_5O_{12}$ Phosphor", *Journal of the Electrochemical Society: Solid State Science and Technology*, pp. 2623-2628 (Oct. 1987).

Xingren Liu et al., "Selectively excited emission and $Tb^{3+} \rightarrow Ce^{3+}$ energy transfer in yttrium aluminum garnet", *Physical Review B*, vol. 39, No. 15, pp. 10633-10639.

Shuji Nakamura, Gerhard Fasol, "Super Bright Green InGaN Signle Quantum Well Light Emitting Diodes," The Blue Laser Diode, Springer-Verlag, Berlin Heidelberg, 1997, pp. 209-217.

Shuji Inaho and Takashi Hase, "Phosphors for cathode-ray tubes," *Phosphor Handbook*, chapter 6, section 6, pp. 509-520, Boca Raton, FL, 1999.

* cited by examiner

ARRANGEMENT OF LUMINESCENT MATERIALS, WAVELENGTH-CONVERTING CASTING COMPOUND AND LIGHT SOURCE

This application is a continuation of prior U.S. application Ser. No. 10/840,575, filed Sep. 24, 2004, now U.S. Pat. No. 6,998,771, which is a divisional application of U.S. application Ser. No. 09/786,086, filed May 31, 2001, which is a U.S. National Stage Application for PCT International Application No. PCT/DE00/02405, filed Jul. 24, 2000, which claims priority to German Application No. 199 34 126.5, filed Jul. 23, 1999, and German Application No. 199 63 791.1, filed Dec. 30, 1999. The contents of the prior applications are incorporated herein by reference in their entirety.

The invention concerns an arrangement of luminescent materials, an associated wavelength-converting casting compound and an associated light-source arrangement. This may include an arrangement of luminescent materials for excitation by means of a radiation source and involving the use of a luminescent material having a Ce-activated garnet structure $A_3B_5O_{12}$, in which the first component A contains at least one element from the group consisting of Y, Lu, Sc, La, Gd and Sm and the second component B represents at least one of the elements Al, Ga and In. The arrangement may be part of a wavelength-converting casting compound based on a transparent plastic, especially a casting resin. It may also include an arrangement of luminescent materials with a radiation source that emits radiation in the blue or UV region of the optical region of the spectrum, the radiation being converted partially or completely into longer-wave radiation by means of an arrangement of luminescent materials, and in the case of partial conversion, converted radiation being mixed with emitted radiation from the radiation source to produce white light in particular.

It relates in particular to a yellow-emitting or yellow-green-emitting arrangement of garnet luminescent materials for excitation by means of wavelengths in the blue or near-ultraviolet region of the spectrum. The casting compound provided is in particular a cast-resin matrix containing the arrangement of luminescent materials, and the light source is in particular a light-emitting diode (LED) in combination with the arrangement of luminescent materials and the casting compound.

A luminescent material for light sources and an associated light source are known from WO 98/05078. The light source employed therein is a garnet of the structure $A_3B_5O_{12}$:D, in which the first component consists of at least one of various rare-earth metals and component B is one of the elements Al, Ga and In. The dopant D is cerium (Ce).

A similar luminescent material in which either Ce or terbium (Tb) is used as a dopant is known from WO 97/50132. Ce emits in the yellow region of the spectrum, whereas Tb emits in the green. In both cases, the luminescent material is used in combination with a blue-emitting light source to attain a white mixed color.

A wavelength-converting casting compound based on a luminescent material known from the above-cited publications and a transparent casting matrix are known from WO 98/12757. The disclosure content of this document is incorporated herein by reference.

In the production of white mixed light, for example in accordance with WO 97/50132, whose disclosure content, especially with respect to the composition and production of the casting, is also incorporated by reference into this description, it is known to vary the color temperature or the color locus of the white light by appropriate choice, i.e. composition, of the luminescent material, its particle size and its concentration. However, optimization of the hue (color locus X and Y in the CIE chromaticity diagram) of the white light produced is a relatively onerous undertaking. This applies in particular to the so-called achromatic point or "equal energy point" located at the coordinates CIEX=0.33 and CIEY=0.33.

It is also onerous to optimize the luminescent material for the purpose of achieving better color rendition through a larger proportion of red in the spectrum.

Finally, it is difficult to optimize the luminescent material in terms of its absorption maximum relative to the peak value of the emission from the light emitter.

It is accordingly an object of the present invention to provide an arrangement of luminescent materials of the kind described in the introduction hereto, which can be produced quickly and simply on the basis of optimization parameters and is suitable for use with an associated wavelength-converting casting compound and an associated light source.

The invention attains this object by means of the features of Claim 1 and the features of Claims 4 and 9. Advantageous improvements and refinements of the invention are set forth in the dependent claims.

In accordance with the invention, an arrangement of luminescent materials comprising plural luminescent materials is used especially preferably for light sources emitting in the short-wave optical region of the spectrum, especially in the blue or near-ultraviolet spectral regions. Such luminescent materials preferably have a cerium-doped garnet structure $A_3B_5O_{12}$, in which the first component A contains at least one element from the group consisting of Y, Lu, Sc, La, Gd, Sm and Tb and the second component B represents at least one of the elements aluminum, gallium and indium.

The production and mode of action of the described luminescent materials is described in the publications cited in the introduction hereto. Particularly worth noting in this regard is the fact that terbium (Tb), when excited in the spectral region between about 400 and 500 nm as a constituent of the host lattice, i.e., the first component A of the garnet, is suitable for use as a yellow-emitting luminescent material whose dopant is cerium. Terbium has previously been proposed in addition to cerium as an activator for emission in the green region of the spectrum. It is possible to use terbium as the principal constituent of the first component A of the garnet, alone or in combination with at least one of the other rare-earth metals proposed hereinabove.

Especially preferred is a garnet of the structure

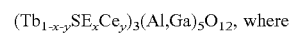
$(Tb_{1-x-y}SE_xCe_y)_3(Al,Ga)_5O_{12}$, where

SE=Y, Gd, La, Sm and/or Lu;

$0 \leq x \leq 0.5-y$;

$0 < y < 0.1$.

Here, the concentration of Tb in the first component (A) is between 50 and 100 atomic %. At least one of the elements Al and Ga is used as the second component (B). The second component B can additionally contain In. The activator is cerium.

These luminescent materials absorb electromagnetic radiation with a wavelength in the range of 420 nm to 490 nm and can therefore be excited to irradiate a blue light source, especially a semiconductor LED. GaN- or InGaN-based LED semiconductor chips emitting blue light with an emission maximum in the range of 430 to 480 nm are especially well suited for this purpose.

The term "GaN- or InGaN-based light-emitting diode chip" is basically to be understood, in the context of the present invention, as a light-emitting diode chip whose radiation-emitting region contains GaN, InGaN and/or related nitrides, together with mixed crystals based thereon, such as Ga(Al,In)N, for example.

Such light-emitting diode chips are known, for example, from Shuji Nakamura and Gerhard Fasol, *The Blue Laser Diode*, Springer Verlag, Berlin/Heidelberg, 1997, pp. 209 et seq.

The previously described luminescent materials are excited by blue light and in turn emit light whose wavelength is shifted into the range above 500 nm. In the case of cerium-activated Tb-garnet luminescent materials, the emission maximum is at about 550 nm.

The above-cited luminescent material absorbs in the range 420 to 490 nm and can thus be excited by the radiation from a blue light source. Good results have been obtained with a blue-light-emitting LED chip whose emission maximum is at 430 to 470 nm. The emission maximum of the Tb-garnet: cerium luminescent material is at about 550 nm.

This luminescent material lends itself especially well to use in a white-light-emitting LED component based on the combination of a blue-light-emitting LED chip with a mixture of luminescent materials including a Tb-garnet-containing luminescent material that is excited by the absorption of a portion of the emission from the LED chip and whose emission complements the remaining radiation from the LED to produce white light.

Especially suitable for use as a blue-light-emitting LED chip is a Ga(In)N LED chip, but also any other way of producing a blue LED that emits in the 420 to 490 nm range. 430 to 470 nm is especially recommended as the principal emission range, since the efficiency is highest in that case.

The position of the absorption and emission bands of the mixture of luminescent materials can be finely adjusted through the choice of the type and quantity of rare-earth metals. The most suitable range for x in the case of the above-cited Tb-garnet luminescent material when used in combination with light-emitting diodes is $0.25 \leq x \leq 0.5-y$.

The especially preferred range for y is $0.02<y<0.06$.

Well-suited for use as a component of the luminescent material is a garnet of the structure

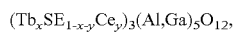

$(Tb_xSE_{1-x-y}Ce_y)_3(Al,Ga)_5O_{12}$, where SE=Y, Gd, La and/or Lu;
$0 \leq x \leq 0.02$, especially x=0.01;
$0<y<0$. y is often in the range 0.01 to 0.05.

In general, relatively small amounts of Tb in the host lattice primarily serve the purpose of improving the properties of known cerium-activated luminescent materials, while larger amounts of Tb, for example, above the 2 atomic % identified above, can be added specifically to shift the emission wavelength of known cerium-activated luminescent materials. A high proportion of Tb is therefore especially well suited for white LEDs with a low color temperature of less than 5000 K.

It is known to use blue-emitting LEDs based on gallium nitride or indium-gallium nitride with emission maxima in the range of 430 to 480 nm to excite a luminescent material of the YAG:Ce type, which is described extensively in the literature. Such a luminescent material is sold, for example, by the Osram company under the designation L175. Other luminescent materials are known in which the element yttrium (Y) is partially or completely replaced by one of the above-cited rare-earth metals.

In a luminescent diode suitable for the mixture of luminescent materials according to the invention, the yttrium atoms are for the most part replaced by terbium. The luminescent material can, for example, have the composition $(Y_{0.29}Tb_{0.67}Ce_{0.04})_3Al_5O_5$, referred to hereinafter as L175/Tb with 67% Tb.

It is provided in accordance with the invention to furnish the hue and the color locus of the system of luminescent materials by mixing pigmented luminescent-material powders of different compositions and thus different absorption maxima for blue light. This can be done, for example, by mixing the luminescent material L175 (pure YAG:Ce) with a luminescent material of the described type, in which yttrium is partially or completely replaced by terbium (L175/Tb, Tb>0%). The ratio of the ingredients can be 1:1. Instead of YAG:Ce, however, it is possible to use another luminescent material, or another luminescent material produced by modification of said luminescent material, with the further option of varying the ratio of the ingredients.

A particular advantage of the invention lies in the fact that luminescent materials that are available in powdered form can be mixed readily and therefore permit specific adjustment of the target color locus on the CIE chromaticity diagram. Hence, on the chromaticity diagram, proceeding from a garnet structure such as pure YAG:Ce and the color locus of the LED used, a bundle of lines can be plotted, one of which passes through the chosen coordinates of the target color locus. Through the combination of an LED chip and an arrangement of luminescent materials, the slope of the resulting color locus line of the individual color loci can be varied slightly. It is therefore possible without further effort to produce a light-source arrangement that includes an LED and a wavelength-converting luminescent material and whose resulting color locus line passes exactly through the equal energy point at the coordinates X=0.33 and Y=0.33 on the color locus diagram. This equal energy point defines pure white. In addition, a shift in the resulting color spectrum, for example in the direction of a higher proportion of red in the spectrum, which generally results in better color rendition, can be effected by incorporating higher proportions of L175/Tb, for example.

It is further provided in accordance with the invention to disperse an arrangement of luminescent materials according to the invention in a casting compound that is at least partially transparent to the generated radiation, preferably in a plastic, especially preferably in an epoxy, silicone or acrylate casting resin or in a mixture of such resins, or in another suitable radiation-transmissive material, such as inorganic glass, for example. For this purpose, the arrangement of luminescent materials according to the invention is preferably produced as a mixture of pigment powders with the casting resin and additional elements according to the method disclosed in WO 98/12757.

Further provided in accordance with the invention is a light-source arrangement associated with the arrangement of luminescent materials, in which a radiation source emits radiation in the blue region or in the UV region of the optical spectrum, e.g., between about 400 and 500 nm, and this radiation is partially or completely converted into longer-wave radiation by means of the arrangement of luminescent materials according to the invention, the converted radiation being mixed, in the case of partial conversion, with the emitted radiation from the radiation source to produce white mixed light.

Such a light-source arrangement, although comprising only one luminescent material, is also known from WO 98/12757.

The invention is described in more detail hereinbelow with reference to an exemplary embodiment in conjunction with FIGS. 1 and 2 of the drawing, wherein:

FIG. 1 illustrates a color locus diagram in which the abscissa is color locus coordinate X of the CIE chromaticity diagram and the ordinate is color locus coordinate Y.

The plot is based on a light-source arrangement for producing white mixed light, as described in WO 97/50132, for example.

The LED is, for example, an InGaN-based LED chip that emits in the blue region of the spectrum and whose color locus point C in the color locus chart is accordingly located at about x=0.14 and y=0.02. Different color locus lines are obtained by mixing the blue light from the LED of color locus C and the emitted light from a luminescent material, for example embedded in a transparent casting resin.

For instance, if pure YAG:Ce is used as the luminescent material, a color locus line 1 is obtained. When a luminescent material is used in which Y is partially or predominantly replaced with terbium, the resulting color locus line passes below color locus line 1. With the use of a luminescent material with a Tb content in the A position of 67% (based on the formula stated hereinabove), color locus line 2 plotted in the chart is obtained.

Figure 1:
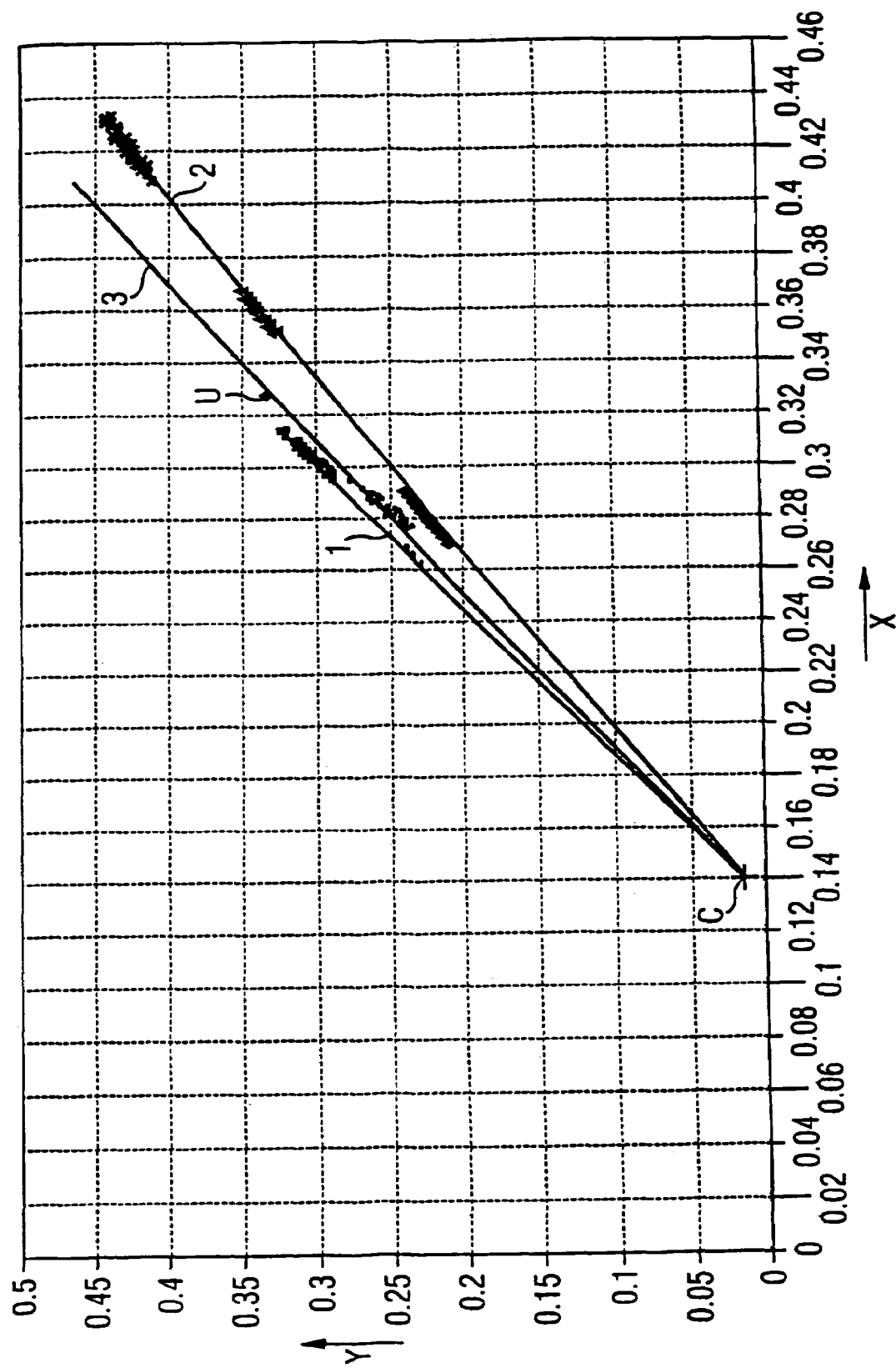
FIG. 1 is a color locus diagram showing color locus lines of various luminescent materials and of the arrangement of luminescent materials according to the invention.

Line 1 passes above and line 2 passes below the equal energy point U, which is situated at the color locus coordinates X=0.33 and Y=0.33. If the two luminescent materials yielding color lines 1 and 2 are mixed in a 1:1 ratio and embedded in transparent casting resin (cf. the exemplary embodiment disclosed below, as depicted in FIG. 2), the result is a color locus line 3 which, as the diagram of FIG. 1 shows, passes exactly through the equal energy point or white point on the color locus diagram.

In like manner, by mixing various luminescent materials, preferably of a garnet structure, it is possible to obtain color locus curves through various desired coordinates on the CIE chromaticity diagram.

The mixture of luminescent-material powders is advantageously embedded in a suitably optimized casting resin, it being possible to optimize the particle sizes of the luminescent-material powders, in particular. Methods for producing such wavelength-converting casting compounds are described in WO 98/12757.

Figure 2:
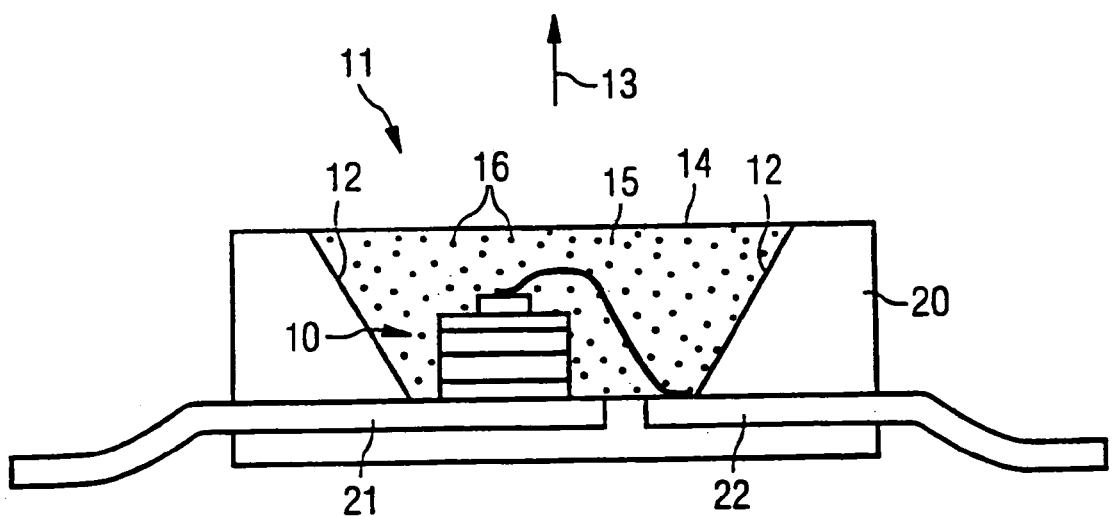
FIG. 2 is a schematic cross section through the exemplary embodiment of an arrangement of luminescent materials according to the invention.

In the especially preferred exemplary embodiment of a light-source arrangement illustrated schematically in FIG. 2, a GaN- or InGaN-based light-emitting-diode chip 10 is disposed in a recess 11 in a radiopaque base housing 20, preferably of plastic, for a light-emitting diode.

The base housing 20 for a light-emitting diode is penetrated by electrical connection paths or legs 21, 22 via which the electrical interconnections of the chip 10 are led out of the housing.

The inner walls 12 of recess 11 form a reflector for the light emitted by chip 10 and for the light emitted by the mixture of luminescent materials, and deflect this light in the direction 13 of maximum radiation of the chip 10.

Recess 11 is filled with a casting compound 14 that comprises a transparent matrix 15 of casting resin, preferably epoxy casting resin or acrylate resin (e.g. polymethyl methacrylate) or a mixture of said resins, in which the mixture 16 of luminescent-material powders is embedded.

The mixture of luminescent-material powders preferably contains luminescent pigments with particle sizes $\leq 20$ μm and a mean particle size $d_{50} \leq 5$ μm.

In addition to casting resin 15 and luminescent pigments 16, casting compound 14 further preferably contains a thixotropic agent, a mineral diffusor, a water repellent and/or a bonding agent.

In the exemplary embodiment, for example, a white-light-emitting LED component is present in which the casting compound 14 contains the dye powders L175 (YAG:Ce) and L175/Tb (with 67% Tb) in a 1:1 ratio and which emits mixed white light whose color locus is situated on lines 3 in the diagram shown in FIG. 1.

It goes without saying that the explanation of the invention made with reference to the above-described exemplary embodiment is not to be construed as a restriction of the invention to the described features per se. As the light source, it is possible to use not only semiconductor bodies composed of light-emitting-diode chips or laser diode chips, but also polymer LEDs. Also within the scope of the invention are luminescent-material powders containing, in addition to pure YAG/Ce, fractions of Lu, Sc, La, Gd and Sm rather than Y. Further included are garnets in which the percentage of terbium is lower than in the above-described formula for a luminescent material.

The arrangement of luminescent materials in accordance with the invention and the associated casting compound can basically be used with all the designs of light-emitting-diode components disclosed in WO 97/50132 and WO 98/12757.

The invention claimed is:

1. A wavelength converting compound comprising a Ce-activated Tb-garnet with at least one element from the group consisting of Al, Ga and In, wherein a portion of Tb is substituted by at least Sc wherein said Tb-garnet is embedded in a radiation transmissive matrix material and is provided as a powder.

2. The wavelength converting compound of claim 1, wherein said radiation transmissive matrix material is inorganic glass.

3. The wavelength converting compound according to claim 1, wherein said radiation transmissive matrix material comprises at least one element from the group consisting of epoxy, silicone and acrylate.

4. The wavelength converting compound according to claim 1, wherein the concentration of Tb in an A-component of the Tb-garnet is higher than 1 Atomic %.

5. The wavelength converting compound according to claim 1, wherein the concentration of the Tb in an A-component of the Tb-garnet is higher than 2 Atomic %.

6. The wavelength converting compound according to claim 1, wherein the concentration of Tb in an A-component of the Tb-garnet is higher than 50 Atomic %.

7. Light-emitting component comprising a blue-light-emitting light source and a wavelength converting compound according to claim 1, said blue light being partially converted into longer wavelength radiation by said wavelength converting compound.

8. Light-emitting component according to claim 7, wherein said blue-light-emitting light source is provided with said wavelength converting compound.

9. Light-emitting component according to claim 7, wherein the blue light emitted by said light source and the converted light emitted by said wavelength converting compound is mixed and yields white light.

10. Light-emitting component according to claim 7, wherein said light source emits radiation from the range of 400 to 500 nm.

11. Light-emitting component according to claim 7, wherein said light source emits radiation from the range of 420 to 490 nm.

12. White-light-emitting component comprising a wavelength converting compound according to claim 1.

13. The wavelength converting compound of claim 1, wherein said Ce-activated Tb-garnet is mixed with at least one other inorganic luminescent pigment powder in the radiation transmissive matrix material.

14. The wavelength converting compound of claim 13, wherein said luminescent pigment powders have particle sizes $\leq 20$ μm and a mean particle diameter $d50 \leq 5$ μm.

15. The wavelength converting compound of claim 13, further comprising at least one member of the group consisting of a thixotropic agent, a mineral diffusor, a water repellent and a bonding agent, in the radiation transmissive matrix material.

16. The wavelength converting compound of claim 13, wherein said mixture of inorganic luminescent pigment powders is excitable by radiation from the range of 400 to 500 nm.

17. The wavelength converting compound of claim 16, wherein said mixture of inorganic luminescent pigment powders is excitable by radiation from the range of 420 to 490 nm.

18. A wavelength converting compound comprising a Ce-activated Tb-garnet with at least one element from the group consisting of Al, Ga and In, wherein a portion of Tb is substituted by at least one element selected from the group consisting of Y, Lu, La, Gd and Sm or wherein Tb is not substituted by any of these elements, wherein said Tb-garnet is embedded in a radiation transmissive matrix material and is provided as a powder.

19. The wavelength converting compound of claim 18, wherein said radiation transmissive matrix material is inorganic glass.

20. The wavelength converting compound according to claim 18, wherein said radiation transmissive matrix material comprises at least one element from the group consisting of epoxy, silicone and acrylate.

21. The wavelength converting compound according to claim 18, wherein the concentration of Tb in an A-component of the Tb-garnet is higher than 1 Atomic %.

22. The wavelength converting compound according to claim 18, wherein the concentration of the Tb in an A-component of the Tb-garnet is higher than 2 Atomic %.

23. The wavelength converting compound according to claim 18, wherein the concentration of Tb in an A-component of the Tb-garnet is higher than 50 Atomic %.

24. Light-emitting component comprising a blue-light-emitting light source and a wavelength converting compound according to claim 18, said blue light being partially converted into longer wavelength radiation by said wavelength converting compound.

25. Light-emitting component according to claim 24, wherein said blue-light-emitting light source is provided with said wavelength converting compound.

26. Light-emitting component according to claim 24, wherein the blue light emitted by said light source and the converted light emitted by said wavelength converting compound is mixed and yields white light.

27. Light-emitting component according to claim 24, wherein said light source emits radiation from the range of 400 to 500 nm.

28. Light-emitting component according to claim 24, wherein said light source emits radiation from the range of 420 to 490 nm.

29. White-light-emitting component comprising a wavelength converting compound according to claim 18.

30. The wavelength converting compound of claim 18, wherein said Ce-activated Tb-garnet is mixed with at least one other inorganic luminescent pigment powder in the radiation transmissive matrix material.

31. The wavelength converting compound of claim 30, wherein said luminescent pigment powders have particle sizes $\leq 20$ μm and a mean particle diameter $d50 \leq 5$ μm.

32. The wavelength converting compound of claim 30, further comprising at least one member of the group consisting of a thixotropic agent, a mineral diffusor, a water repellent and a bonding agent, in the radiation transmissive matrix material.

33. The wavelength converting compound of claim 30, wherein said mixture of inorganic luminescent pigment powders is excitable by radiation from the range of 400 to 500 nm.

34. The wavelength converting compound of claim 30, wherein said mixture of inorganic luminescent pigment powders is excitable by radiation from the range of 420 to 490 nm.

* * * * *

UNITED STATES PATENT AND TRADEMARK OFFICE
CERTIFICATE OF CORRECTION

PATENT NO. : 7,261,837 B2 Page 1 of 1
APPLICATION NO. : 11/296673
DATED : August 28, 2007
INVENTOR(S) : Alexandra Debray et al.

It is certified that error appears in the above-identified patent and that said Letters Patent is hereby corrected as shown below:

<u>Title Page</u>; item (56);
References Cited, U.S. Patent Documents, please add the following patents:

--7,063,807    6/20/2006    Kummer et al.--
--7,115,217    10/3/2006    Kummer et al.--
--7,132,786    11/7/2006    Debray et al.--

Signed and Sealed this

Twelfth Day of August, 2008

JON W. DUDAS
*Director of the United States Patent and Trademark Office*